(12) United States Patent
Popek

(10) Patent No.: US 11,398,773 B2
(45) Date of Patent: Jul. 26, 2022

(54) FILTER FOR POWER TRAIN

(71) Applicant: GOODRICH CONTROL SYSTEMS, Solihull (GB)

(72) Inventor: Grzegorz Popek, Birmingham (GB)

(73) Assignee: GOODRICH CONTROL SYSTEMS, Solihull (GB)

( * ) Notice: Subject to any disclaimer, the term of this patent is extended or adjusted under 35 U.S.C. 154(b) by 0 days.

(21) Appl. No.: 16/702,613

(22) Filed: Dec. 4, 2019

(65) Prior Publication Data

US 2021/0083568 A1    Mar. 18, 2021

(30) Foreign Application Priority Data

Sep. 13, 2019   (EP) .................................. 19197373

(51) Int. Cl.
| | |
|---|---|
| *H02P 27/06* | (2006.01) |
| *H02M 1/12* | (2006.01) |
| *H02P 29/50* | (2016.01) |
| *H01F 17/04* | (2006.01) |
| *H02M 1/44* | (2007.01) |
| *H01F 17/00* | (2006.01) |
| *H03H 7/09* | (2006.01) |

(52) U.S. Cl.
CPC ............ *H02M 1/126* (2013.01); *H01F 17/04* (2013.01); *H02M 1/44* (2013.01); *H02P 27/06* (2013.01); *H02P 29/50* (2016.02); *H01F 2017/0093* (2013.01); *H02M 1/123* (2021.05); *H03H 7/09* (2013.01)

(58) Field of Classification Search
CPC .. H02M 1/126; H02M 1/44; H02M 2001/123; H02P 27/06
See application file for complete search history.

(56) References Cited

U.S. PATENT DOCUMENTS

| | | | |
|---|---|---|---|
| 3,668,507 A | 6/1972 | Kadomsky et al. | |
| 5,831,410 A | 11/1998 | Skibinski | |
| 5,990,654 A * | 11/1999 | Skibinski ............... | H02M 1/126 307/105 |
| 6,122,184 A | 9/2000 | Enjeti et al. | |
| 6,304,013 B1 | 10/2001 | Akers et al. | |
| 7,116,076 B2 * | 10/2006 | Sippola .................. | H02M 1/126 318/400.25 |
| 7,738,268 B2 * | 6/2010 | Baudesson ............ | H02M 1/126 363/39 |

(Continued)

FOREIGN PATENT DOCUMENTS

| | | |
|---|---|---|
| CN | 2807593 Y | 8/2006 |
| EP | 682402 B1 | 1/1998 |

(Continued)

OTHER PUBLICATIONS

Extended European Search Report for International Application No. 19197373.4 dated Mar. 2, 2020, 7 pages.

*Primary Examiner* — Rina I Duda
(74) *Attorney, Agent, or Firm* — Cantor Colburn LLP

(57) ABSTRACT

An output filter for a power train between a power supply and a motor, the filter comprising a common mode inductor, comprising an inductance for each phase line of the power train, and a resistance for each phase line, connected in parallel with the respective phase line inductance of the common mode inductor.

6 Claims, 4 Drawing Sheets

(56) References Cited

U.S. PATENT DOCUMENTS

| | | | | |
|---|---|---|---|---|
| 8,174,810 | B2* | 5/2012 | Tallam | H02M 1/126 |
| | | | | 361/91.1 |
| 8,228,019 | B2* | 7/2012 | Higuchi | H03H 7/427 |
| | | | | 318/722 |
| 9,570,773 | B2* | 2/2017 | Yamane | C08L 27/18 |
| 9,667,128 | B2* | 5/2017 | Patel | H02M 5/4585 |
| 9,800,134 | B2* | 10/2017 | Patel | H03H 7/06 |
| 2006/0043920 | A1 | 3/2006 | Baker | |
| 2009/0267431 | A1 | 10/2009 | Tallam et al. | |
| 2011/0050135 | A1* | 3/2011 | Higuchi | H02M 1/126 |
| | | | | 318/400.2 |
| 2011/0089767 | A1 | 4/2011 | Rocke et al. | |
| 2013/0218491 | A1* | 8/2013 | Wei | G01R 31/52 |
| | | | | 702/58 |
| 2013/0241451 | A1* | 9/2013 | Wei | H02J 9/005 |
| | | | | 318/400.3 |
| 2014/0104901 | A1* | 4/2014 | Nguyen | H02M 1/44 |
| | | | | 363/48 |
| 2016/0164448 | A1* | 6/2016 | Kane | H02M 1/44 |
| | | | | 318/400.24 |
| 2016/0248334 | A1* | 8/2016 | Patel | H03H 7/1741 |
| 2018/0100889 | A1* | 4/2018 | Swamy | G01R 31/2843 |

FOREIGN PATENT DOCUMENTS

| | | |
|---|---|---|
| EP | 2631104 B1 | 7/2015 |
| JP | 2014132811 A | 7/2014 |
| WO | 2006056235 A1 | 6/2006 |
| WO | 2009110354 A1 | 9/2009 |
| WO | 2015180558 A1 | 12/2015 |

* cited by examiner

FILTER FOR POWER TRAIN

FOREIGN PRIORITY

This application claims priority to European Patent Application No. 19197373.4 filed Sep. 13, 2019, the entire contents of which is incorporated herein by reference.

TECHNICAL FIELD

The present disclosure relates to a filter to mitigate transmission line effects in a power drive line such as in an AC motor drive system.

BACKGROUND

Power trains typically include a power source connected to a load such as a motor via a power convertor/inverter. For example a three phase AC motor is conventionally driven from a power supply. If the power supply is AC power, a rectifier will convert the AC power to DC power on a DC link. An inverter provides the required three-phase AC power, e.g. at a different frequency from the power supply, to drive the motor, from the DC power. The drive power for the motor is often transmitted to the motor over long cables or lines.

The power cables have an inherent inductance and capacitance and a mismatch between the cable impedance and the connected motor and other components can cause electrical reflections along the power cable. These reflections result in surges or spikes of current and voltage which can cause so-called transmission line effects at the motor terminals. Such surges can have amplitudes of double the DC link voltage. These effects can cause damage to the motor windings and/or conductor insulation which can result in failure of the motor.

Various solutions to transmission line effects have been proposed, such as providing a filter in the form of a respective inductor or a respective LC circuit in series with each phase line at the motor input. Such solutions, however, can result in loss of capacitance due to self-healing effects and loss of prime functionality.

In one approach, transmission line effects are managed by the output RLC filter which 'slows down' the edges of the PWM signal to the motor. Such an arrangement can, however, lead to losses due to power dissipation. This is particularly problematic in e.g. aerospace applications. The use of capacitors can also give rise to reliability concerns. Similar concerns exist for approaches involving providing RC terminators at the motor terminals.

An alternative approach to handling transmission line effects is the use of an RL output filter. Such a filter dissipates less power and does not have the problems associated with capacitors.

Another problem with known power drives is that fast dv/dt transitions can inject a large common mode (CM) current into the chassis of the system such that the system is no longer compliant with e.g. EMI requirements. Large CM current can also contribute to ageing of the motor assembly.

Most of the solutions proposed for managing transmission line effects, discussed above, will not have significant impact on the CM current.

U.S. Pat. No. 5,990,654 teaches an RL output filter to limit transmission line effects in differential mode and also adds a common mode choke in series with the filter to reduce transmission line effects in common mode operation. It has to be stressed that transmission line effect developed and cured in U.S. Pat. No. 5,990,654 in CM mode operation is a different phenomenon to CM current which flows through the motor.

Because the resonant frequency will vary from motor to motor dependent on the parasitic capacitance of the motor, the actual CM current flowing through motor will vary. The power train has to be compliant with electromagnetic emission standards for all motors at critical systems interfaces. Different filters need to be designed depending on the characteristics of the motor to accommodate the resonance of the motor load.

It would be desirable to provide a filter for a power train that effectively and efficiently manages transmission line effects and also reduces CM currents. It would also be desirable if a single filter could be designed for use with different motors.

SUMMARY

According to the disclosure, there is provided an output filter for a power train between a power supply and a motor, the filter comprising: a common mode inductor, comprising an inductance for each phase line of the power train, and a resistance for each phase line, connected in parallel with the respective phase line inductance of the common mode inductor.

A differential mode inductor may also be provided in series with the common mode inductor.

A power train incorporating such an output filter is also provided.

The output filter may be used with a single or multiple phase power train.

DETAILED DESCRIPTION

Figure 1:
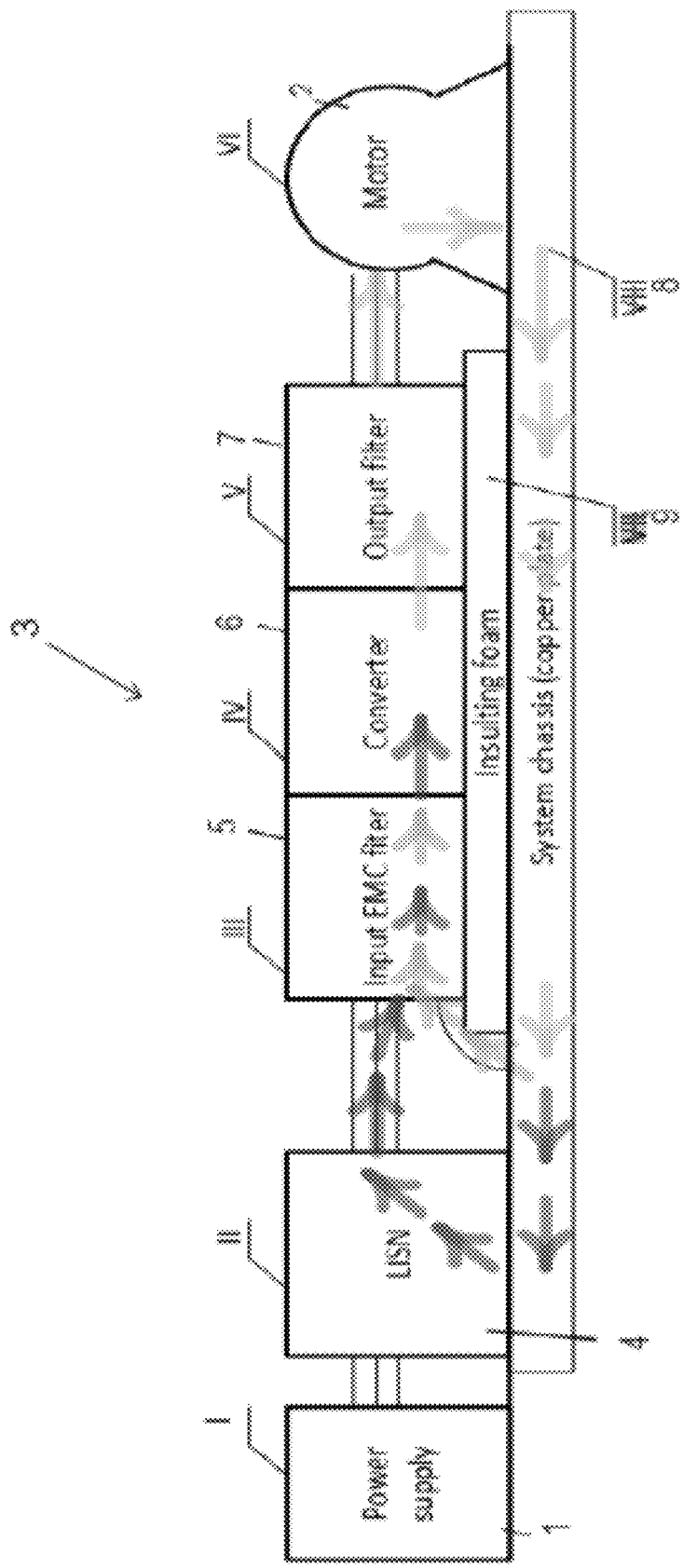
FIG. 1 is a schematic diagram of the components of a typical power train for a motor.

The described embodiments are by way of example only. The scope of this disclosure is limited only by the claims.

A typical drive line or power train for a motor is described with reference to FIG. 1. Power is provided from a power supply 1 to a motor 2 along a power train 3. The power (here AC power) from the power supply 1 passes through a line impedance stabilising network, LISN, 4 and through a converter which comprises, here, an input EMC filter 5 to reduce high frequency electronic noise that may cause interference with other devices, and a main converter 6. An output filter 7 is then generally provided to mitigate transmissions line effects as described above. The converter and input and output filters are mounted to a system chassis 8 via insulating foam 9. The LISN and the motor are mounted directly onto the chassis 8 which is e.g. a copper plate. (NOTE: the description describes above describes the system configured for emission testing, in a real system some parts like insulation foam 9 and LISN 4 will be absent)

Depending on the power needed to drive the motor, if rapid dv/dt transitions occur in the converter, the converter 6 can create a common mode voltage which is projected across common mode impedance paths causing common mode current flow as shown by the arrows in FIG. 1. The parasitic capacitance of the motor together with the inductance of the line and the motor at one specific frequency forms series resonance. At this resonance, the impedance of the common mode path is so low that noise from the converter—i.e. in the form of common mode current that originates in the main converter 6, goes through the output filter 7 and to the chassis 8 via the parasitic capacitance of the motor winding. As seen from the arrows in FIG. 1, part of this CM current returns via the EMC filter 5 and part through the LISN (or, if there is no LISN, to the power supply 1).

The common mode resonant frequency will vary from motor to motor. For large motors, the CM resonant frequency might be in the lower range, e.g. hundreds of kHz but for small motors may be in the MHz range.

As described above, various solution have been proposed to address transmission line effects including those in CM mode. The filter of the present disclosure aims to address both transmission line effects and also the problem of CM current creating problems of EMC compliance depending on the motor resonant frequency, effectively.

Figure 4A:
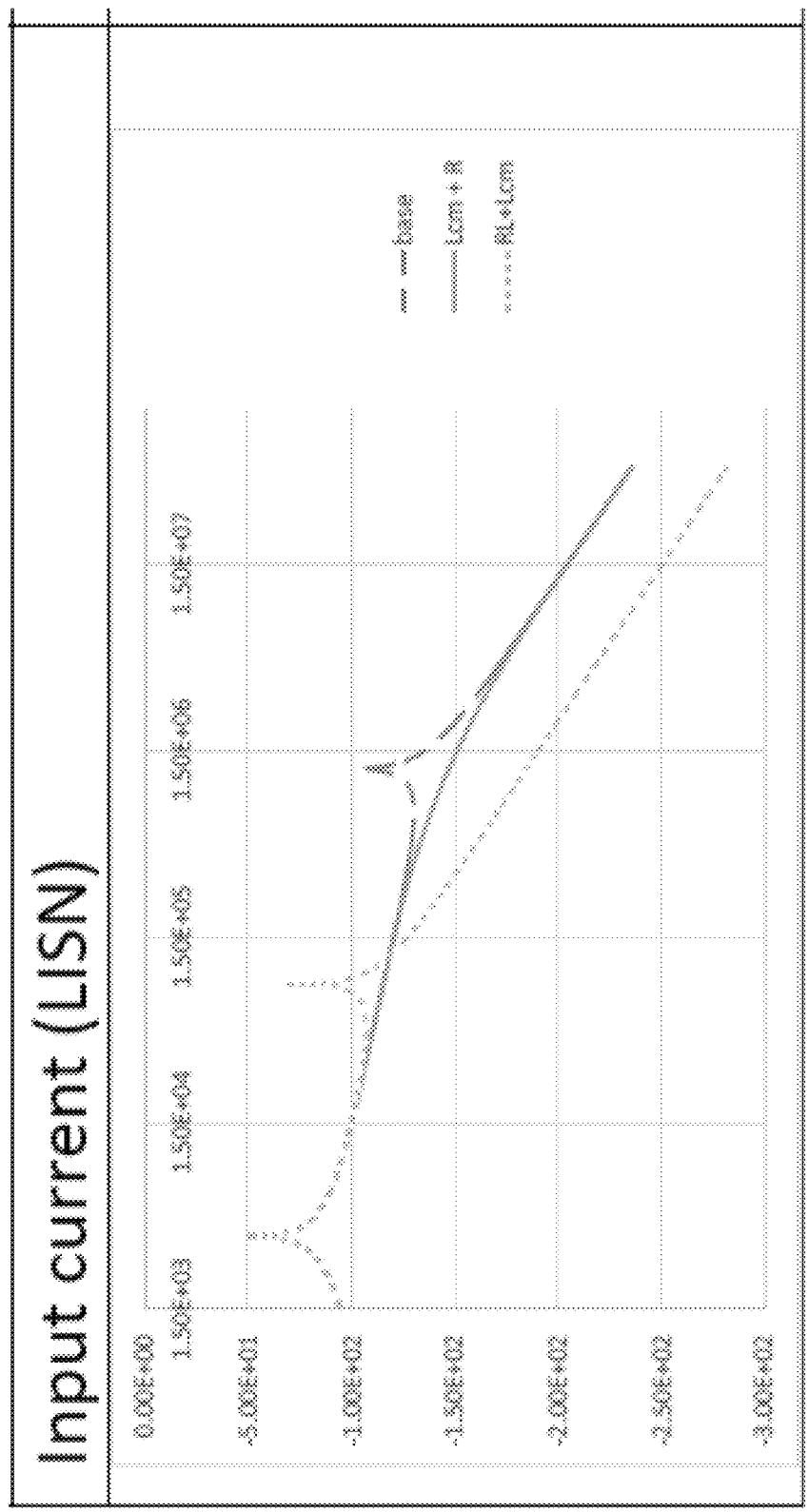
FIG. 4 is a graph showing characteristics of a power train with (FIG. 4B) and without (FIG. 4A) a filter according to this disclosure.
Figure 4B:
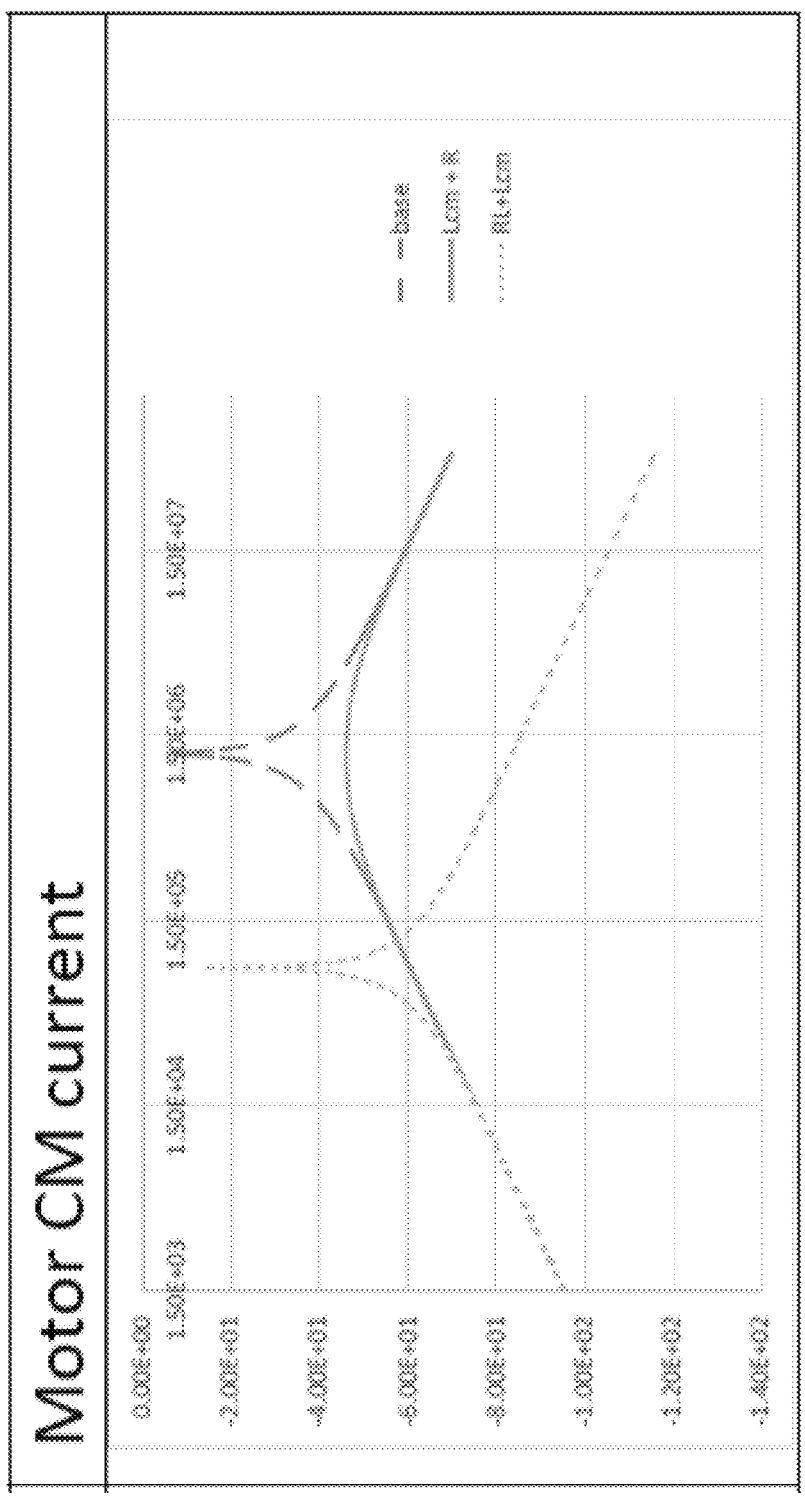

The results of tests will be described, with reference to FIGS. 4a and 4b by way of explanation of the effects of the filter of this disclosure.

To perform simulations, an equivalent model was formed to represent a system such as shown in FIG. 1, with an LISN, optimised input EMC filter, an output filter and a model of the parasitic common mode impedance of the motor.

Without any output filter the input current (represented by dashed lines in FIG. 4A) was seen to have two resonant points; a first at a low frequency defined by the LISN's input capacitance and the system inductance, and a second at a higher frequency (around 1.5 MHz) corresponding to the motor CM resonant frequency. The output current (represented by dashed lines in FIG. 4B) exhibited a single resonant point caused by the motor CM impedance.

When an RL filter in series with a common mode choke (such as described in U.S. Pat. No. 5,990,654 mentioned above) was added as the output filter, the resonant point (dotted lines in FIG. 4B) shifted to a lower frequency region (around 100 kHz) but did cause a higher current at that lower frequency. The increased size due to the CM choke also had to be accounted for. Attenuation at higher frequencies was good. It should be noted, however, that outside of the test environment, parasitic and material properties would have an effect on reducing this attenuation and at much higher frequencies, attenuation would also be reduced.

The continuous line shows the currents using the filter of this disclosure. This shows no negative impact on the lower frequency range compared to the RL plus choke arrangement and, in addition, eliminates the motor CM resonance spike due to the dissipative nature of the filter.

The structure of the filter will now be described.

Figure 2:
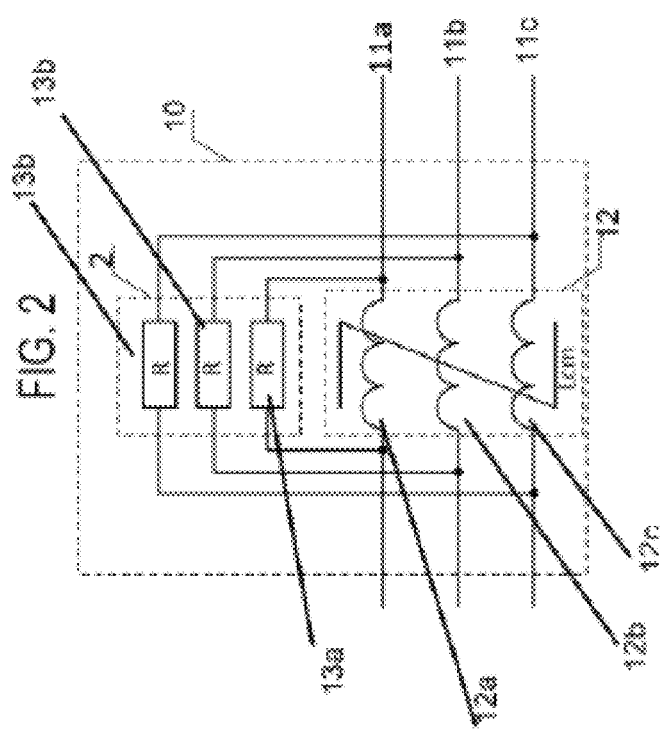
FIG. 2 is a schematic circuit diagram of one filter according to this disclosure.

With reference to FIG. 2, the filter 10 of the present disclosure, which will be provided at the location of the output filter 7 of FIG. 1 in an AC motor drive system, has a common mode inductor 12 across each phase line 11a, 11b, 11c of the power train at the output of the converter/input to the motor. The common mode inductor 12 comprises a bank of inductors 12a,b,c—one for each phase line. The example described here is a three phase drive. The filter may also be advantageously used in a single phase system.

The filter further includes a resistance 13a, 13b, 13c connected to each phase line 11a, 11b, 11c in parallel with the common mode inductor 12.

Figure 3:
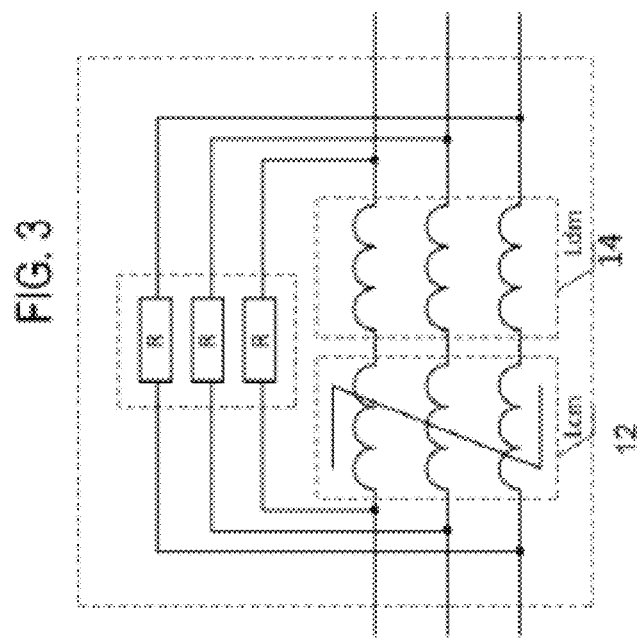
FIG. 3 is a schematic circuit diagram of an alternative filter according to this disclosure.

In addition, as shown in the example of FIG. 3, a differential mode inductor 14 may be connected in series with the common mode inductor 12 in which case the resistances 13a, 13b and 13c are also in parallel with the differential mode inductor 14.

The filter arrangement will, for transmission line effect management, act as an RL filter comprising, for each phase, a respective parallel connected resistor and an inductor from the CM inductor 12. This will manage transmission line effects as described in the following.

As mentioned above, when a voltage pulse is generated by a converter between transmission lines, some of the pulse will be reflected back towards the converter. The combined forward and reflected pulses can generate a spike which can be twice the DC voltage. With the filter of this disclosure, provided between the converter and the motor terminals, the inductors 12a, 12b, 12c will initially present a large impedance to the initial pulse which will force the pulse to route through its corresponding resistor 13 a,b,c instead. The resistor will form together with the characteristic impedance of the cable, a temporary voltage divider resulting in reduction of voltage which enters the cable. For lower frequencies (like fundamental current stator frequency) impedance of the inductor will be lower in comparison with the resistor. A similar effect takes place in the reverse direction for the reflected pulses whereby the inductor impedances will be high, thus forcing the pulses through the resistors where they will be re-reflected to the cable or terminated.

The same arrangement will also cause common mode current reduction by acting as a common mode RL circuit with the set of resistors 13a, 13b, 13c together forming the R and the combined inductance of the CM choke 12 forming the L. In the case of an arrangement such as in FIG. 3 with a CM choke and a differential mode choke in series, the inductance of the common mode RL circuit is the combined inductance of the two chokes 12, 14. The CM choke impedance will be high for CM transient currents and so the current will preferentially flow through the resistors 13 where it will dissipate energy. Generally the inductive part of the CM choke can be made of a ferrite magnetic material which better dissipates power. Ferrites do not, however, work effectively at dissipating power at lower frequencies (such as the resonant frequency of larger motors) but the parallel arrangement of the present filter will effectively mimic the high frequency behaviour of the ferrites by providing a dissipative path which will increase resistance at the resonant point of the motor. The values of the resistors and inductors will, therefore, be selected based on the resonant frequency of the motor to cause this reduction in CM current and not on cable length.

The arrangement of this disclosure provides control of transmission line effects at the motor terminals and also reduces CM current by forming an RL common mode dissipative impedance. The converter output impedance stays as resistive at higher frequencies. These results are all achieved without the use of capacitors.

The invention claimed is:

1. A power train for a motor comprising:
an input EMC filter for connection to a power supply;
a converter connected to an output of the input EMC filter; and
an output filter connected to an output of the converter, the output filter comprising:

a common mode inductor, comprising an inductance for each phase line of the power train, and a resistance for each phase line, connected in parallel with the respective phase line inductance of the common mode inductor; and a differential mode inductor connected in series with the common mode inductor, whereby the resistances are connected in parallel across both the common mode inductor and the differential mode inductor;

wherein the values of inductance and resistance are selected such that the inductance for each phase line will initially present a large impedance relative to the resistance to an initial pulse to force the initial pulse to route through the resistance for that phase line; and wherein the resistance forms with the characteristic impedance of a connected transmission line cable, a voltage divider, and wherein the inductances and resistances are configured to form a common mode RL circuit with the total sum of the resistances together forming the R value of the RL circuit and the total sum of the impedances together forming the L value of the RL circuit.

2. A power train for a motor according to claim 1, further comprising the power supply and the motor connected to an output of the output filter.

3. The power train of claim 1, wherein:
the power train includes three phases;
the common mode inductor comprises a bank of three inductors; and
the output filter comprises three resistances, each connected in parallel across a respective one of the three inductors of the bank.

4. The power train of claim 1, wherein:
the power train includes three phases;
the common mode inductor comprises a bank of two inductors; and
the output filter comprises two resistances, each connected in parallel across a respective one of the two inductors of the bank.

5. The power train of claim 1, wherein:
the power train includes a single phase;
the common mode inductor comprises a single inductor; and
the filter comprises a single resistance.

6. The power train of claim 2, wherein:
the power train includes a single phase;
the common mode inductor comprises a single inductor; and
the filter comprises a single resistance.

* * * * *